US012660270B2

(12) United States Patent
Schulze et al.

(10) Patent No.: US 12,660,270 B2
(45) Date of Patent: Jun. 16, 2026

(54) WIDE BAND GAP SEMICONDUCTOR DEVICE AND MANUFACTURING METHOD

(71) Applicant: Infineon Technologies AG, Neubiberg (DE)

(72) Inventors: Hans-Joachim Schulze, Taufkirchen (DE); Rudolf Elpelt, Erlangen (DE); Jens Peter Konrath, Villach (AT); Konrad Schraml, Feldkirchen (DE)

(73) Assignee: Infineon Technologies AG, Neubiberg (DE)

( * ) Notice: Subject to any disclaimer, the term of this patent is extended or adjusted under 35 U.S.C. 154(b) by 476 days.

(21) Appl. No.: 18/124,842

(22) Filed: Mar. 22, 2023

(65) Prior Publication Data

US 2023/0317797 A1     Oct. 5, 2023

(30) Foreign Application Priority Data

Apr. 4, 2022     (EP) .................................... 22166544

(51) Int. Cl.
| | |
|---|---|
| *H01L 29/16* | (2006.01) |
| *H10D 12/00* | (2025.01) |
| *H10D 12/01* | (2025.01) |
| *H10D 30/01* | (2025.01) |
| *H10D 30/66* | (2025.01) |
| *H10D 62/832* | (2025.01) |
| *H10D 62/85* | (2025.01) |

(52) U.S. Cl.
CPC ....... *H10D 62/8325* (2025.01); *H10D 12/031* (2025.01); *H10D 12/032* (2025.01); *H10D 12/441* (2025.01); *H10D 30/0291* (2025.01); *H10D 30/66* (2025.01); *H10D 62/8503* (2025.01)

(58) Field of Classification Search
CPC ............. H10D 62/8325; H10D 12/031; H10D 12/032; H10D 12/441; H10D 30/0291; H10D 30/66; H10D 62/8503; H10D 62/129; H10D 8/00; H10D 12/411; H10D 62/60; H10D 62/85; H10D 62/10; H10D 62/124
See application file for complete search history.

(56) References Cited

U.S. PATENT DOCUMENTS

| | | | |
|---|---|---|---|
| 6,888,226 | B2 | 5/2005 | Diefenbeck et al. |
| 8,354,709 | B2 | 1/2013 | Schulze et al. |
| 9,324,783 | B2 | 4/2016 | Falck et al. |
| 10,529,809 | B2 | 1/2020 | Kuenle et al. |

(Continued)

*Primary Examiner* — Cuong B Nguyen
(74) *Attorney, Agent, or Firm* — Murphy, Bilak & Homiller, PLLC

(57)     ABSTRACT

A wide band gap semiconductor device includes a semiconductor body having a first surface and a second surface opposite to the first surface along a vertical direction. The semiconductor device further includes a first region of a first conductivity type adjoining at least partially the first surface, a drift region of a second conductivity type, a highly doped second region adjoining the second surface, and a buffer region of the second conductivity type arranged between the drift region and the highly doped second region. A vertical profile of a doping concentration of the buffer region includes at least one step in a first section and is increasing approximately exponentially toward the second surface in a second section. The first section is arranged between the second section and the highly doped second region.

18 Claims, 2 Drawing Sheets

(56)         References Cited

U.S. PATENT DOCUMENTS

| | | |
|---|---|---|
| 10,700,168 B2 | 6/2020 | Lutz et al. |
| 2004/0201044 A1 | 10/2004 | Diefenbeck et al. |
| 2007/0108558 A1* | 5/2007 | Nemoto ................. H10D 8/045 |
| | | 257/656 |
| 2008/0128798 A1 | 6/2008 | Schulze et al. |
| 2016/0197170 A1 | 7/2016 | Yoshimura et al. |
| 2016/0322472 A1 | 11/2016 | Schloegl et al. |
| 2019/0051488 A1 | 2/2019 | Schustereder et al. |
| 2019/0066977 A1 | 2/2019 | Jelinek et al. |
| 2019/0157401 A1 | 5/2019 | Kuenle et al. |
| 2019/0198621 A1 | 6/2019 | Lutz et al. |
| 2020/0194584 A1 | 6/2020 | Lichtenwalner et al. |
| 2021/0050421 A1 | 2/2021 | Leendertz et al. |
| 2021/0242340 A1 | 8/2021 | Siemieniec et al. |

* cited by examiner

WIDE BAND GAP SEMICONDUCTOR DEVICE AND MANUFACTURING METHOD

TECHNICAL FIELD

The present disclosure is related to a wide band gap semiconductor device, in particular to a wide band gap semiconductor device comprising a buffer region.

BACKGROUND

Technology development of new generations of wide band gap semiconductor devices, e.g. SiC power semiconductor devices, aims at improving electric device characteristics and reducing costs by shrinking device geometries. Although costs may be reduced by shrinking device geometries, a variety of tradeoffs and challenges have to be met when increasing device functionalities per unit area. For example, a trade-off between avalanche robustness and short circuit withstand capability requires design optimization.

Thus, there is a need for an improved wide band gap semiconductor device.

SUMMARY

An example of the present disclosure relates to a wide band gap semiconductor device. The wide band gap semiconductor device includes a semiconductor body having a first surface and a second surface opposite to the first surface along a vertical direction. The wide band gap semiconductor device further includes a first region of a first conductivity type adjoining at least partially the first surface, a drift region, and a highly doped second region adjoining the second surface. The wide bandgap semiconductor device further includes a buffer region of the second conductivity type arranged between the drift region and the highly doped second region. A vertical profile of a doping concentration of the buffer region includes at least one step in a first section and is increasing exponentially toward the second surface in a second section. The first section is arranged between the second section and the highly doped second region.

Another example of the present disclosure relates to a method of manufacturing a wide band gap semiconductor device. The method includes forming, in a semiconductor body having a first surface and a second surface opposite to the first surface along a vertical direction, a first region of a first conductivity type adjoining the first surface. The method further includes forming a drift region. The method further includes forming a highly doped second region adjoining the second surface. The method further includes forming a buffer region of the second conductivity type arranged between the drift region and the highly doped second region. A vertical profile of a doping concentration of the buffer region includes at least one step in a first section and is increasing approximately exponentially toward the second surface in a second section. The first section is arranged between the second section and the highly doped second region.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of wide band gap semiconductor devices and together with the description serve to explain principles of the examples. Further examples are described in the following detailed description and the claims.

DETAILED DESCRIPTION

Figure 1:
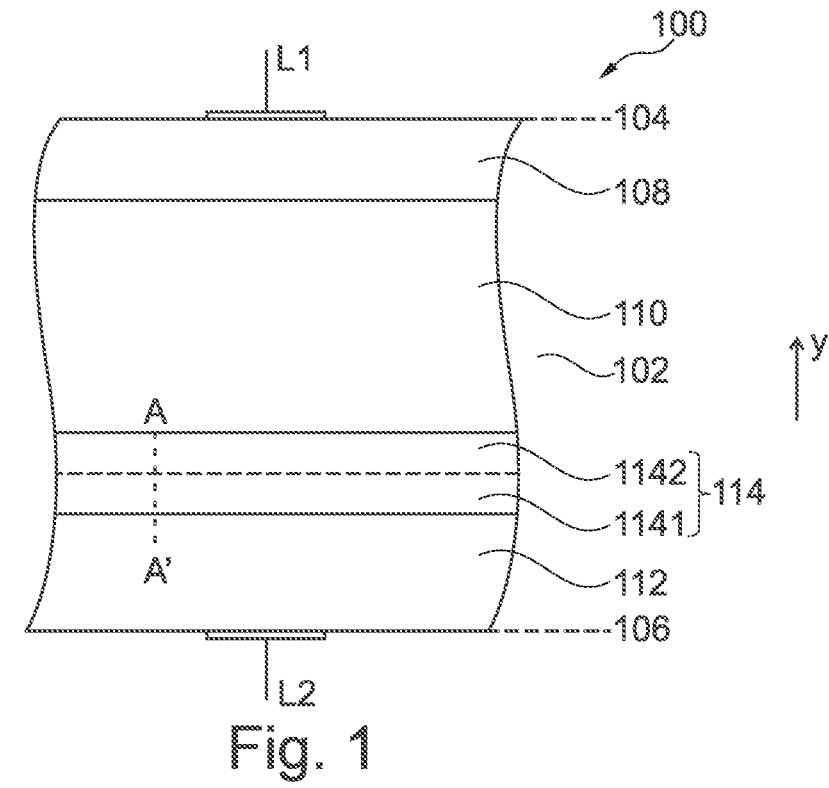
FIG. 1 is a partial cross-sectional view for illustrating an example of a wide band gap semiconductor device including a buffer region.

In the following detailed description, reference is made to the accompanying drawings, which form a part hereof and in which are shown by way of illustrations specific examples of wide band gap semiconductor devices. It is to be understood that other examples may be utilized and structural or logical changes may be made without departing from the scope of the present disclosure. For example, features illustrated or described for one example can be used in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" may describe a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact is a non-rectifying electrical junction.

Ranges given for physical dimensions include the boundary values. For example, a range for a parameter y from a to b reads as a y b. The same holds for ranges with one boundary value like "at most" and "at least".

The terms "on" and "over" are not to be construed as meaning only "directly on" and "directly over". Rather, if one element is positioned "on" or "over" another element (e.g., a layer is "on" or "over" another layer or "on" or "over" a substrate), a further component (e.g., a further layer) may be positioned between the two elements (e.g., a further layer may be positioned between a layer and a substrate if the layer is "on" or "over" said substrate).

An example of wide band gap semiconductor device may include a semiconductor body having a first surface and a second surface opposite to the first surface along a vertical direction. The wide band gap semiconductor device may further include a first region of a first conductivity type adjoining at least partially the first surface, a drift region, and a highly doped second region adjoining the second surface.

The drift region may, for example, be of a second conductivity type. The wide bandgap semiconductor device may further include a buffer region of the second conductivity type arranged between the drift region and the highly doped second region. A vertical profile of a doping concentration of the buffer region may include at least one step in a first section and may be increasing approximately exponentially toward the second surface in a second section. The first section is arranged between the second section and the highly doped second region.

The wide band gap semiconductor device may be part of an integrated circuit, or may be a discrete semiconductor device or a semiconductor module, for example. The wide band gap semiconductor device may be or a may include an insulated gate field effect transistor (IGFET) such as a metal oxide semiconductor field effect transistor (MOSFET), an insulated gate bipolar transistor (IGBT), a thyristor, or a pn junction diode, or a Schottky junction diode, for example. The wide band gap semiconductor device may be a vertical semiconductor device having a load current flow between the first surface and the second surface opposite to the first surface. The vertical power semiconductor device may be configured to conduct currents of more than 1 A, or more than 10 A, or more than 30 A, or more than 50 A, or more than 75 A, or even more than 100 A, and may be further configured to block voltages between load electrodes, e.g. between collector and emitter on an IGBT, or between drain and source of a MOSFET, or between cathode and anode of a diode, in the range of several hundreds of up to several thousands of volts, e.g. 400 V, 650V, 1.2 kV, 1.7 kV, 3.3 kV, 4.5 kV, 5.5 kV, 6 kV, 6.5 kV, 10 kV. The blocking voltage may correspond to a voltage class specified in a datasheet of the power semiconductor device, for example.

The wide band gap semiconductor device may be based on a semiconductor body from a crystalline wide band gap semiconductor material having a band gap larger than the band gap of silicon, i.e. larger than 1.12 eV. The wide band gap semiconductor material may have a hexagonal crystal lattice and may be silicon carbide (SiC) or gallium nitride (GaN), by way of example. For example, the semiconductor material may be 2H—SiC (SiC of the 2H polytype), 6H—SIC or 15R—SiC. According to an example, the semiconductor material is silicon carbide of the 4H polytype (4H—SiC). The semiconductor body may include or consist of a semiconductor substrate having none, one or more than one semiconductor layers, e.g. epitaxially grown layers, thereon.

The first surface may be a front surface or a top surface of the semiconductor body, and the second surface may be a back surface or a rear surface of the semiconductor body, for ex-ample. The semiconductor body may be attached to a lead frame via the second surface, for example. Over the first surface of the semiconductor body, bond pads may be arranged and bond wires may be bonded on the bond pads, for example.

The first region of a first conductivity type adjoining at least partially the first surface may be a body region of a MOSFET, or an anode region of a diode or an emitter region of an IGBT, for example. The first conductivity may be a p-type and the second conductivity type may be an n-type, e.g. for an n-channel MOSFET. However, the first conductivity type may also be an n-type and the second conductivity type may be a p-type, e.g. for a p-channel MOSFET. The first region may be electrically connected to a first load electrode of the wide band gap semiconductor device. The first electrode load electrode may be an emitter electrode of an IGBT, a source electrode of a MOSFET, or an anode of a diode, for example. The first load electrode may be part of a wiring area over the semiconductor body. The wiring area may include one or more than one, e.g. two, three, four or even more wiring levels. Each wiring level may be formed by a single one or a stack of conductive layers, e.g. metal layer(s). The wiring levels may be lithographically patterned, for example. Between stacked wiring levels, an interlayer dielectric structure may be arranged. Contact plug(s) or contact line(s) may be formed in openings of the interlayer dielectric structure to electrically connect parts, e.g. metal lines or contact areas, of different wiring levels to one another. The first load electrode may be formed by one or more elements of the wiring area.

The first region may form a pn junction with the drift region. The blocking voltage of the wide band gap semiconductor device may be adjusted by an impurity or doping concentration and/or a vertical extension of a drift region in the semiconductor body. The drift region may be of the second conductivity type. For example, the drift region may be a doped region located between the first region and the buffer region. The drift region may be a single doped region or may comprise several regions with further doped regions (e.g. of the first conductivity type) in between. For example, the drift region may comprise a current spread region. Separately or in combination, the drift region may comprise pillars of the second conductivity type. The pillars of the second conductivity type may be interrupted by pillars of the first conductivity type. The pillars may form a so-called superjunction structure.

A doping concentration of the drift region may gradually or in steps increase or decrease with increasing distance to the first surface at least in portions of its vertical extension. According to other examples, the impurity concentration in the drift region may be approximately uniform. For wide band gap power semiconductor device based on SiC, a mean impurity concentration in the drift region may be between $5 \times 10^{14}$ cm$^{-3}$ and $1 \times 10^{17}$ cm$^{-3}$, for example in a range from $1 \times 10^{15}$ cm$^{-3}$ to $2 \times 10^{16}$ cm$^{-3}$. A vertical extent of the drift region may depend on voltage blocking requirements, e.g. a specified voltage class, of the wide band gap semiconductor device. When operating the wide band gap semiconductor device in voltage blocking mode, a space charge region may vertically extend partly or totally through the drift region depending on the blocking voltage applied to the wide band gap semiconductor device. When operating the wide band gap semiconductor device at or close to the specified maximum blocking voltage, the space charge region may reach or penetrate into a buffer region that is configured to prevent the space charge region from further reaching to a contact of a second load electrode at the second surface. The second load electrode may be a collector electrode of an IGBT, or a drain electrode of a MOSFET, or a cathode of a diode, for example.

For realizing a desired current carrying capacity, the wide band gap semiconductor device may be designed by a plurality of parallel-connected wide band gap semiconductor device cells. The parallel-connected wide band gap semiconductor device cells may, for example, be wide band gap semiconductor device cells formed in the shape of a strip or a strip segment. Of course, the wide band gap semiconductor device cells can also have any other shape, e.g. circular, elliptical, polygonal such as hexagonal or octahedral. The wide band gap semiconductor device cells may be arranged in an active area of the semiconductor body. The active area may be an area where an emitter region of an IGBT, or a source region of a MOSFET or anode region of a diode at the first surface and a collector region of an IGBT, or a drain region of a MOSFET or a cathode region of a diode are arranged opposite to one another along the vertical direction. In the active area, a load current may enter or exit the semiconductor body of the wide band gap semiconductor device, e.g. via contact plugs on the first surface of the semiconductor body. The wide band gap semiconductor device may further include an edge termination area that may include a termination structure. In a blocking mode or in a reverse biased mode of the wide band gap semiconductor device, the blocking voltage between the active area and a field-free region laterally drops across the termination structure. The termination structure may have a higher or a slightly lower voltage blocking capability than the active area. The termination structure may include a junction termination extension (JTE) with or without a variation of lateral doping (VLD), one or more laterally separated guard rings, or any combination thereof, for example.

The highly doped second region adjoining the second surface may be a collector region, e.g. a highly doped rear side emitter region, of the first conductivity type in case the wide band gap semiconductor device is an IGBT. The highly doped second region adjoining the second surface may also be a drain region of the second conductivity type in case the wide band gap semiconductor device is an IGFET such as a MOSFET. The highly doped second region adjoining the second surface may also be a cathode region in case the wide band gap semiconductor device is a diode. The highly doped semiconductor region may also be configured, e.g. by doping amount and material, for an ohmic contact to a second load electrode, e.g. a metallization layer, and/or to ensure safe handling during manufacturing processes by providing a thickness of the semiconductor body sufficient for mechanical stability.

Any step of the at least one step in a first section of the buffer region may have a step-like profile shape determined by the manufacturing possibilities for such doping profiles. For example, the step-like profile shapes may have a certain degree of curvature that is caused by process technology, e.g. by thermal diffusion processes of dopants or supply of precursor gases. The same holds true for the approximately exponential increase of the doping profile in the second section of the buffer region, which may be manufactured, for example, by a fast reduction of supply of dopants from a high doping level in the buffer region down to a doping level of the drift region. Auto-doping processes may result in the exponential decrease of the profile toward the drift region. For example, the approximately exponential increase of the doping profile in the second section of the buffer region may be approximated by a plurality of steps. For example, a local deviation, e.g. caused by semiconductor processing for approximating an exponential increase of a doping profile, from an ideal exponential increase of the approximately exponential increase of the doping profile in the second section of the buffer region may be smaller than 50%, or smaller than 30%, or even smaller than 15%.

The vertical profile of doping concentration in the buffer region may enable an improvement of avalanche robustness and short circuit withstand capability. This may allow for improving reliability of wide band gap semiconductor devices by suppressing or reducing early device failures. The vertical profile of doping concentration in the buffer region may further allow for an improvement of robustness against bipolar degradation. Moreover, since by the above buffer profile a buffer thickness may be reduced for achieving a desired robustness against degradation, manufacturing costs may be decreased. In addition, the buffer profiles described herein allow for a partial compensation of an electron current (in case of an n-channel MOSFET) during short circuit, avalanche, or fast switching by positive space charge. Thereby, peaks heights of electric field strength may be reduced. Moreover, lattice matching from a highly doped substrate to a drift region (having a doping concentration of several orders of magnitude lower than the substrate) may be improved by the buffer profile. This may allow for a reduction of lattice strain, and thereby, for an improvement of robustness against bipolar degradation. Another benefit is an improvement of the softness during turn-off of the devices in view of the doping profile of the buffer, because the penetration of the space charge region is slowed down during turn-off.

For example, the vertical profile of a doping concentration of the buffer region may include a plurality of steps in the first section that increase toward the second surface. The number of steps may be two, three, four, five, six, or even more. Step heights, e.g. a step in a doping concentration in the buffer region, may at least differ from one another. However, some or all of the step heights may also be equal to one another on a logarithmic scale. By adapting the step heights and vertical extents of the steps, an electric field profile toward the second surface may be adapted to the specific requirements of the wide band gap semiconductor device.

For example, vertical extents of the plurality of steps may differ by at most 10% from one another. The vertical extents may refer to the vertical distances between characteristic positions of the steps, e.g. a reference height of the step height such as half of the step height.

For example, the vertical extents of the plurality of steps may range from 0.2 μm to 5 μm, or from 0.3 μm to 3 μm, or from 0.4 μm to 2 μm, or from 0.5 μm to 1.5 μm. The vertical extents of the steps may differ from one another. For example, the vertical extents of the steps may increase or decrease toward the second surface. This may allow for adapting reduction of the electric field toward the second surface to specific requirements of the device.

For example, a step closest to the highly doped second region may have a maximum doping concentration of at least $8 \times 10^{17}$ cm$^{-3}$, or even more than $2 \times 10^{18}$ cm$^{-3}$.

For example, the vertical profile of a doping concentration of the buffer region may include at least one step in a third section arranged between the second section and the drift region. The number of steps in the buffer region may be two, three, four, five, six, or even more. Number, step heights and step widths may be adapted for setting a desired electric field decrease toward the second surface in a voltage blocking mode of the wide band gap semiconductor device, for example. A vertical extent of such steps may be, for example, in the range between 100 nm and 1000 nm, or between 150 nm and 500 nm.

A maximum doping concentration of the at least one step in the first section may be at least one order of magnitude larger, e.g. between one order of magnitude and two orders of magnitude larger, than a minimum doping concentration of the at least one step in the third section.

For example, the vertical profile of a doping concentration of the buffer region may increase approximately exponentially toward the second surface over at least one order of magnitude of the doping concentration.

For example, the vertical profile of a doping concentration of the buffer region may increase exponentially toward the second surface over a vertical extent ranging from 1 μm to 10 μm, or from 1.5 μm to 8 μm, or from 2 μm to 5 μm.

For example, a gradient of the vertical profile of a doping concentration of the buffer region in the second section may range from $1\times10^{20}$ cm$^{-4}$ to $3\times10^{21}$ cm$^{-4}$ over at least 20% of a vertical extent of the second section, or from $1\times10^{20}$ cm$^{-4}$ to $1\times10^{21}$ cm$^{-4}$ over at least 20% of a vertical extent of the second section, or from $3\times10^{20}$ cm$^{-4}$ to $1\times10^{21}$ cm$^{-4}$ over at least 20% of a vertical extent of the second section. In some other examples, the above gradient ranges may also apply over at least 30% of a vertical extent of the second section.

For example, the doping concentration of the buffer region may increase by a factor of 2 to 4 from step to step for at least 50% of the steps in the buffer region. In some examples, the factor range may apply for even more than 60%, or more than 80% or even for all of the steps in the buffer region.

For example, the wide band gap semiconductor device may further include a first load electrode electrically connected to the first region via the first surface. The wide band gap semiconductor device may further include a second load electrode electrically connected to the highly doped second region via the second surface. A vertical extent of the buffer region in units of µm may be in a range from 60% to 140% of three times a value of Vbr in units of kV, Vbr being an electric breakdown voltage between the first load electrode and the second load electrode. For an electric breakdown voltage Vbr of 1 kV, the buffer region may have a vertical extent ranging from 1.8 µm to 4.2 µm, for example. The first electrode load electrode may be an emitter electrode of an IGBT, a source electrode of a MOSFET, or an anode of a diode, for example. The first load electrode may be part of a wiring area over the semiconductor body. The second load electrode may be a collector electrode of an IGBT, a drain electrode of a MOSFET, or a cathode of a diode, for example.

For example, a number of steps in the vertical profile of a doping concentration of the buffer region may be in a range from 60% to 140% of $4\times(V_{br}/1000V)^{1/2}$, $V_{br}$ being an electric breakdown voltage between the first load electrode and the second load electrode. For an electric breakdown voltage Vbr of 1 kV, the number of steps in the vertical profile of a doping concentration of the buffer region may buffer region may have be in a range from 2.4 to 5.6, i.e. from 3 to 5, for example.

The examples and features described above and below may be combined.

Functional and structural details (e.g. materials, dimensions) described with respect to the examples above shall likewise apply to the examples illustrated in the figures and described with reference to manufacturing methods further below.

A method of manufacturing a wide band gap semiconductor device may include forming, in a semiconductor body having a first surface and a second surface opposite to the first surface along a vertical direction, a first region of a first conductivity type adjoining the first surface. The method may further include forming a drift region of a second conductivity type. The method may further include forming a highly doped second region adjoining the second surface, and forming a buffer region of the second conductivity type arranged between the drift region and the highly doped second region. A vertical profile of a doping concentration of the buffer region may include at least one step in a first section, and is increasing approximately exponentially toward the second surface in a second section, wherein the first section is arranged between the second section and the highly doped second region.

For example, the buffer doping profiles described herein may be manufactured by time-dependent addition of the desired dopant (e.g. nitrogen or aluminum in SiC, or, alternatively or in addition, doping with phosphorus) during a layer deposition process, e.g. epitaxy process. Alternatively, in case the epitaxy process is interrupted after the deposition of the buffer layer or even before the complete deposition of the buffer layer (depending on the available implantation energies also interrupted several times, if necessary), formation of the buffer region doping may also be carried out by ion implantation of the desired dopant, in which case several implantation energies and implantation doses (a continuous variation of implantation energy and implantation dose is also conceivable) and/or also the combination with channeling implantations can be used to achieve the desired buffer doping profiles. Also the combination with a stepwise or continuous variation of the implantation angle may be used to further increase the accuracy of the desired doping profile setting.

For ion implantation-based buffer profiles, not only vertically but also laterally varying buffer profiles may be manufactured by using suitable masking techniques for ion implantation. For example, a more weakly doped field stop can be used in the region of the edge termination to increase the blocking capability of the edge termination, since there is reduced hole injection into the buffer in this region and thus the risk of bipolar degradation may be substantially reduced.

For example, forming the vertical profile of the doping concentration may include at least one of repeatedly carrying out a layer deposition process followed by at least one ion implantation process, or varying a supply of dopants during a layer deposition process for forming the buffer region.

Some of the above and below examples are described in connection with a silicon carbide substrate. Alternatively, a wide band gap semiconductor substrate, e.g. a wide band gap wafer, may be processed, e.g. comprising a wide band gap semiconductor material different from silicon carbide. The wide band gap semiconductor wafer may have a band gap larger than the band gap of silicon (1.1 eV). For example, the wide band gap semiconductor wafer may be a silicon carbide (SiC) wafer, or gallium arsenide (GaAs) wafer, or a gallium nitride (GaN) wafer.

More details and aspects are mentioned in connection with the examples described above or below. Processing a wide band gap semiconductor wafer may comprise one or more optional additional features corresponding to one or more aspects mentioned in connection with the proposed concept or one or more examples described above or below.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, e.g. by expressions like "thereafter", for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

FIG. 1 schematically and exemplarily shows a partial cross-sectional view of an active area of a wide band gap semiconductor device 100. The wide band gap semiconductor device 100 may be a vertical power semiconductor device that further includes an edge termination area that at least partially surrounds the active area (not illustrated in FIG. 1). The wide band gap semiconductor device 100 includes a SiC semiconductor body 102 having a first surface 104 and a second surface 106 opposite to the first surface 104 along a vertical direction y. A first region 108 of a first conductivity type adjoins at least partially the first surface 104. For example, the first region 108 may be a p-doped anode region of a diode, or a p-doped body region of a MOSFET or IGBT. The wide band gap semiconductor device 100 further includes a drift region 110 of a second conductivity type, e.g. an n$^-$-doped drift region. A highly doped second region 112 adjoins the second surface 106. For example, the highly doped second region 112 may be a p$^+$-doped collector region of an IGBT, or an n$^+$-doped drain or drain contact region of a MOSFET, or an n$^+$-doped cathode or cathode contact region of a diode.

A first load electrode L1 is electrically connected to the first region 108 via the first surface 104 of the semiconductor body 102. A second load electrode L2 is electrically connected to the highly doped second region 112 via the second surface 106 of the semiconductor body 102. A blocking voltage of the wide band gap semiconductor device 100 between the first and second load electrodes L1, L2 may be determined by a breakdown voltage of a pn junction between the first region 108 and the drift region 110, for example.

A buffer region 114 of the second conductivity type, e.g. an n-doped buffer region, is arranged between the drift region 110 and the highly doped second region 112. A vertical profile of a doping concentration c of the buffer region 114 includes at least one step in a first section 1141 and is increasing approximately exponentially toward the second surface 106 in a second section 1142. The first section 1141 is arranged between the second section 1142 and the highly doped second region 112.

Figure 2A:
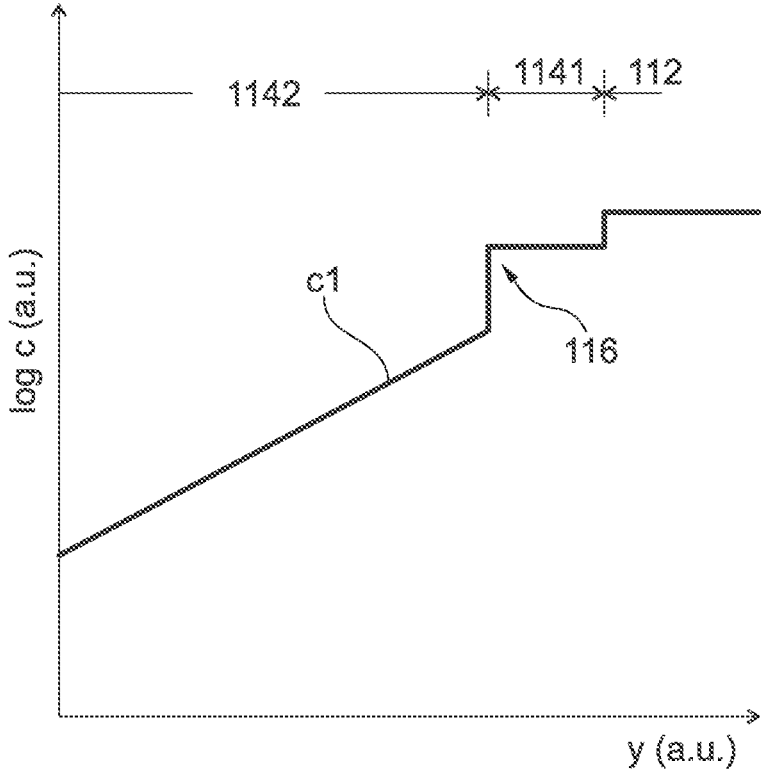
FIGS. 2A to 2C are exemplary graphs for illustrating exemplary vertical profiles of a doping concentration c of the buffer region along a vertical line AA' of FIG. 1.
Figures 2B, 2C:
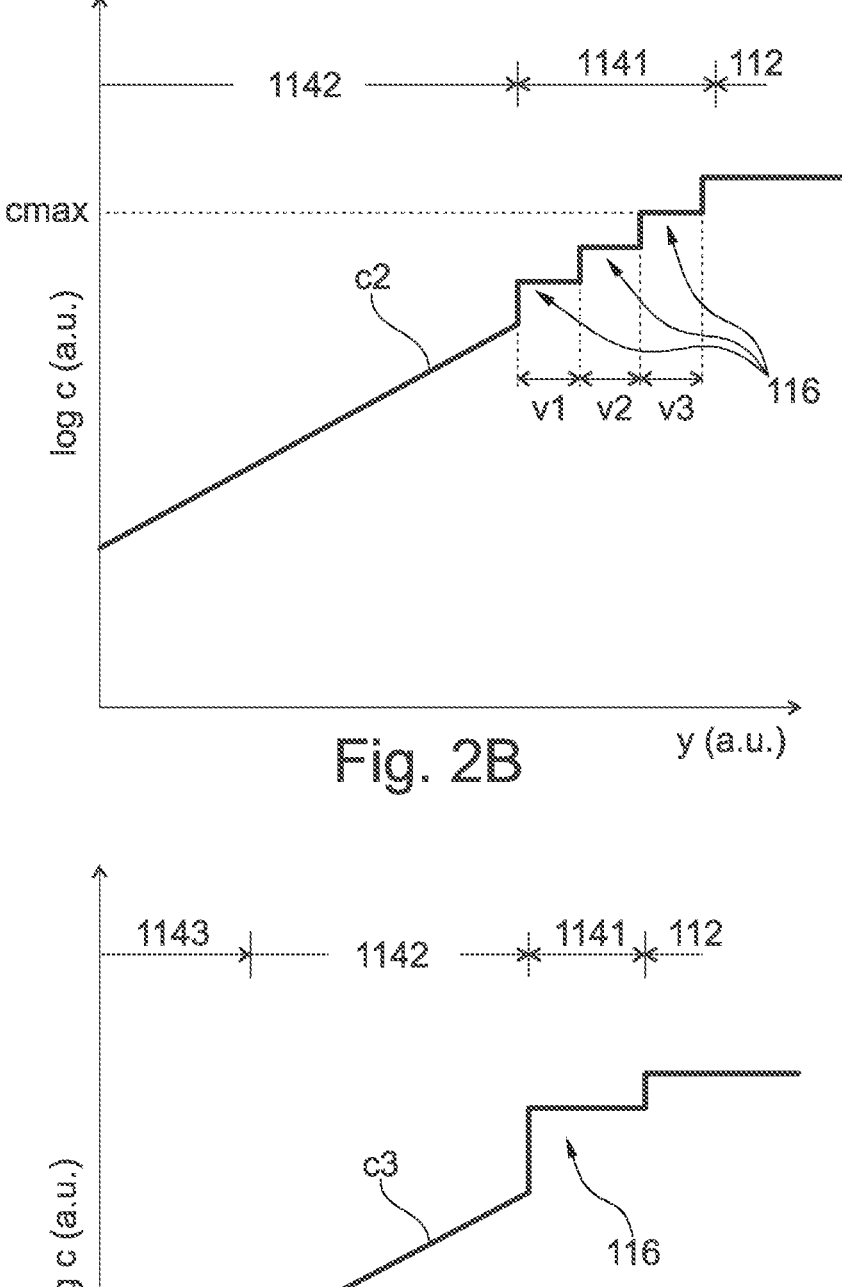

The schematic graphs of FIGS. 2A to 2C illustrate exemplary vertical profiles of a doping concentration c of the buffer region 114 along line AA' of FIG. 1 in a semi-log graph. In the examples of FIGS. 2A to 2C, a conductivity type of the buffer region 114 corresponds to the conductivity type of the highly doped second region 112. The examples of FIGS. 2A to 2C may relate to power semiconductor MOSFETs or power semiconductor diodes, for example.

Referring to FIG. 2A, a vertical profile of a doping concentration c1 of the buffer region 114 includes a step 116 in the first section 1141 and is increasing approximately exponentially toward the second surface 106 in a second section 1142. A transition from the first section 1141 of the buffer region 114 to the highly doped second region 112 may also include a step. A gradient of the vertical profile of a doping concentration c1 of the buffer region 114 in the second section 1142 may range from $1\times10^{20}$ cm$^{-4}$ to $3\times10^{21}$ cm$^{-4}$ over at least 20% of a vertical extent of the second section 1142, for example.

Referring to FIG. 2B, a vertical profile of a doping concentration c2 of the buffer region 114 includes a plurality of steps (here exemplary illustrated: three steps 116) in the first section 1141 and is increasing approximately exponentially toward the second surface 106 in a second section 1142. The number of steps may vary depending on the specific requirements of the wide band gap semiconductor device 100. For example, the number of steps in the vertical profile of the doping concentration c2 of the buffer region 114 may be in a range from 60% to 140% of $4\times(V_{br}/1000V)^{1/2}$, $V_{br}$ being an electric breakdown voltage between the first load electrode L1 and the second load electrode L2. For example, the doping concentration c2 of the buffer region 114 may increase by a factor of 2 to 4 from step to step for at least 50% of the steps in the buffer region 114. In the example illustrated in FIG. 2B, vertical extents v1, v2, v3 of the steps 116 correspond to each other. In some other examples, vertical extents of the plurality of steps 116 may differ by at most 10% from one another. For example, the vertical extents v1, v2, v3 of the steps 116 may range from 0.2 μm to 5 μm, or from 0.3 μm to 3 μm, or from 0.4 μm to 2 μm, or from 0.5 μm to 1.5 μm. The step closest to the highly doped second region 112 may have a maximum doping concentration cmax of at least $8\times10^{17}$ cm$^{-3}$ or at least $2\times10^{18}$ cm$^{-3}$, for example.

Referring to FIG. 2C, a vertical profile of a doping concentration c3 of the buffer region 114 includes at least one step 116 (here exemplary illustrated: one step) in a third section 1143 arranged between the second section 1142 and the drift region 110.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

The aspects and features mentioned and described together with one or more of the previously detailed examples and figures, may as well be combined with one or more of the other examples in order to replace a like feature of the other example or in order to additionally introduce the feature to the other example.

What is claimed is:

1. A wide band gap semiconductor device, comprising:
a semiconductor body having a first surface and a second surface opposite to the first surface along a vertical direction;
a first region of a first conductivity type adjoining at least partially the first surface;
a drift region of a second conductivity type;
a highly doped second region adjoining the second surface; and
a buffer region of the second conductivity type arranged between the drift region and the highly doped second region,
wherein a vertical profile of a doping concentration of the buffer region includes at least one step in a first section, the at least one step having a vertical distance to the highly doped second region, and is increasing approximately exponentially toward the second surface in a second section over at least one order of magnitude,
wherein a local deviation from an ideal exponential increase of the approximately exponential increase of the vertical profile of the doping concentration of the buffer region in the second section is smaller than 50%,
wherein the first section is arranged between the second section and the highly doped second region and adjoins the second section.

2. The wide band gap semiconductor device of claim 1, wherein the vertical profile of the doping concentration of the buffer region includes a plurality of steps in the first section that increase toward the second surface.

3. The wide band gap semiconductor device of claim 2, wherein vertical extents of the plurality of steps differ by at most 10% from one another.

4. The wide band gap semiconductor device of claim 2, wherein vertical extents of the plurality of steps range from 0.2 μm to 5 μm.

5. The wide band gap semiconductor device of claim 1, wherein a step of the vertical profile of the doping concentration of the buffer region closest to the highly doped second region has a maximum doping concentration of at least $8\times10^{17}$ cm$^{-3}$.

6. The wide band gap semiconductor device of claim 1, wherein the vertical profile of the doping concentration of the buffer region includes at least one step in a third section arranged between the second section and the drift region.

7. The wide band gap semiconductor device of claim 6, wherein a maximum doping concentration of the at least one step in the first section is at least one order of magnitude larger than a minimum doping concentration of the at least one step in the third section.

8. The wide band gap semiconductor device of claim 1, wherein the vertical profile of the doping concentration of the buffer region increases approximately exponentially toward the second surface over a vertical extent ranging from 1 μm to 10 μm.

9. The wide band gap semiconductor device of claim 1, wherein a gradient of the vertical profile of the doping concentration of the buffer region in the second section ranges from $1\times10^{20}$ cm$^{-4}$ to $3\times10^{21}$ cm$^{-4}$ over at least 20% of a vertical extent of the second section.

10. The wide band gap semiconductor device of claim 1, wherein the vertical profile of the doping concentration of the buffer region includes a plurality of steps including the at least one step in the first section, and wherein the doping concentration of the buffer region increases by a factor of 2 to 4 from step to step for at least 50% of the steps in the buffer region.

11. The wide band gap semiconductor device of claim 1, further comprising a first load electrode electrically connected to the first region via the first surface, and a second load electrode electrically connected to the highly doped second region via the second surface, and wherein a vertical extent of the buffer region in units of μm is in a range from 60% to 140% of three times a value of Vbr in units of kV, Vbr being an electric breakdown voltage between the first load electrode and the second load electrode.

12. The wide band gap semiconductor device of claim 11, wherein a number of steps in the vertical profile of the doping concentration of the buffer region is in a range from 60% to 140% of $4\times(V_{br}/1000V)^{1/2}$.

13. A method of manufacturing a wide band gap semiconductor device, the method comprising:

forming, in a semiconductor body having a first surface and a second surface opposite to the first surface along a vertical direction, a first region of a first conductivity type adjoining the first surface;

forming a drift region of a second conductivity type;

forming a highly doped second region adjoining the second surface; and forming a buffer region of the second conductivity type arranged between the drift region and the highly doped second region, wherein a vertical profile of a doping concentration of the buffer region includes at least one step in a first section, the at least one step having a vertical distance to the highly doped second region, and is increasing approximately exponentially toward the second surface in a second section over at least one order of magnitude, wherein a local deviation from an ideal exponential increase of the approximately exponential increase of the vertical profile of the doping concentration of the buffer region in the second section is smaller than 50%, wherein the first section is arranged between the second section and the highly doped second region and adjoins the second section.

14. The method of claim 13, wherein forming the vertical profile of the doping concentration comprises:

repeatedly carrying out a layer deposition process followed by at least one ion implantation process.

15. The method of claim 13, wherein forming the vertical profile of the doping concentration comprises:

varying a supply of dopants during a layer deposition process for forming the buffer region.

16. A wide band gap semiconductor device, comprising:

a semiconductor body having a first surface and a second surface opposite to the first surface along a vertical direction;

a first region of a first conductivity type adjoining at least partially the first surface;

a drift region;

a highly doped second region adjoining the second surface; and a buffer region of a second conductivity type arranged between the drift region and the highly doped second region, wherein a vertical profile of a doping concentration of the buffer region includes at least one step in a first section and is increasing approximately exponentially toward the second surface in a second section, wherein the first section is arranged between the second section and the highly doped second region, wherein the vertical profile of the doping concentration of the buffer region includes at least one step in a third section arranged between the second section and the drift region.

17. The wide band gap semiconductor device of claim 16, wherein a maximum doping concentration of the at least one step in the first section is at least one order of magnitude larger than a minimum doping concentration of the at least one step in the third section.

18. A wide band gap semiconductor device, comprising:

a semiconductor body having a first surface and a second surface opposite to the first surface along a vertical direction;

a first region of a first conductivity type adjoining at least partially the first surface;

a drift region;

a highly doped second region adjoining the second surface;

a buffer region of a second conductivity type arranged between the drift region and the highly doped second region;

a first load electrode electrically connected to the first region via the first surface; and a second load electrode electrically connected to the highly doped second region via the second surface, wherein a vertical profile of a doping concentration of the buffer region includes at least one step in a first section and is increasing approximately exponentially toward the second surface in a second section, wherein the first section is arranged between the second section and the highly doped second region, wherein a vertical extent of the buffer region in units of μm is in a range from 60% to 140% of three times a value of Vbr in units of kV, Vbr being an electric breakdown voltage between the first load electrode and the second load electrode, wherein a number of steps in the vertical profile of the doping concentration of the buffer region is in a range from 60% to 140% of $4 \times (\text{Vbr}/1000\text{V})^{1/2}$.

\* \* \* \* \*